United States Patent [19]

Suzuki et al.

[11] 4,103,184

[45] Jul. 25, 1978

[54] FREQUENCY DIVIDER WITH ONE-PHASE CLOCK PULSE GENERATING CIRCUIT

[75] Inventors: Yasoji Suzuki, Ayase; Tadashi Kuroda, Yokohama, both of Japan

[73] Assignee: Tokyo Shibaura Electric Co., Ltd., Tokyo, Japan

[21] Appl. No.: 722,102

[22] Filed: Sep. 10, 1976

[30] Foreign Application Priority Data

Sep. 12, 1975 [JP] Japan ................... 50-109942

[51] Int. Cl.$^2$ .................. H03K 21/00; H03K 23/08
[52] U.S. Cl. ................... 307/225 C; 331/116 R
[58] Field of Search ............ 307/225 C; 331/116 R; 58/23 A

[56] References Cited

U.S. PATENT DOCUMENTS

| | | | |
|---|---|---|---|
| 3,742,248 | 6/1973 | Eaton, Jr. .................. | 307/225 C |
| 3,749,937 | 7/1973 | Rogers ..................... | 307/225 C |
| 3,803,828 | 4/1974 | Keeler et al. ............... | 331/116 R |
| 3,855,549 | 12/1974 | Huener et al. ............. | 331/116 R |
| 3,922,566 | 11/1975 | Kodama et al. ........... | 307/225 C |
| 3,958,187 | 5/1976 | Suzuki et al. ............. | 331/116 R |

OTHER PUBLICATIONS

"Codymos Frequency Dividers Achieve Low Power Consumption and High Frequency", by Oguey et al., Electronics Letters, 8/23/73, vol. 9, No. 17.

*Primary Examiner*—Stanley D. Miller, Jr.
*Attorney, Agent, or Firm*—Finnegan, Henderson, Farabow & Garrett

[57] ABSTRACT

A frequency divider wherein an output from a crystal oscillating circuit comprising a crystal oscillating element and an inverter connected in parallel therewith is sent forth as a one-phase oscillation pulse for frequency division from the input or output side of the inverter to the φ input terminal of a counter formed of a plurality of insulated gate field effect transistors (hereinafter abbreviated "IGFET's"). The counter comprises a plurality of cascade-connected complementary unit circuits each consisting of a series circuit of IGFET's connected between power supply terminals with IGFET's disposed on one side of an imaginary border line connecting the input and output terminals of said complementary unit circuit chosen to have a different channel type from those provided on the other side of said border line, and wherein at least the first and last complementary unit circuits' IGFET's are provided in different numbers on both sides of said border line. A one-phase pulse from the crystal oscillating circuit is supplied to the gate electrodes of the prescribed different IGFET's constituting the plural complementary unit circuits, and an output from the last complementary unit circuit of the counter is conducted to the gate electrodes of the prescribed different IGFET's constituting the other complementary unit circuits.

8 Claims, 16 Drawing Figures

PRIOR ART

F I G. 11
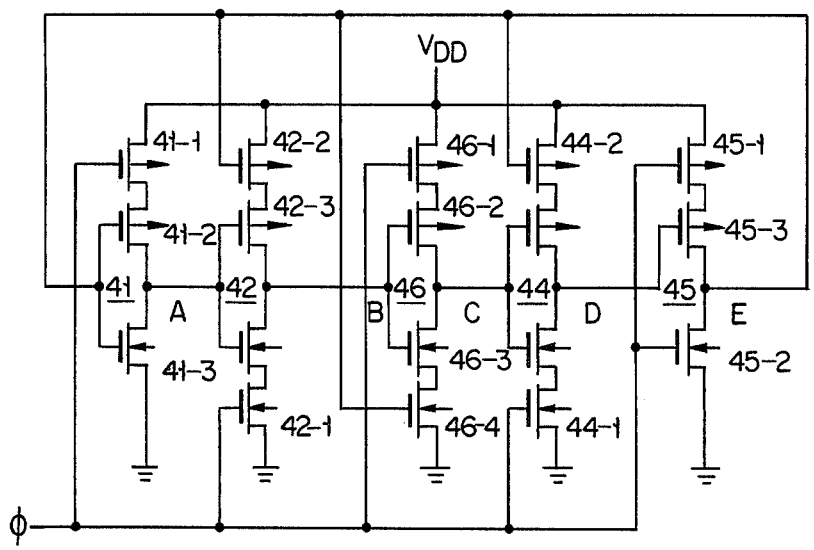
F I G. 12
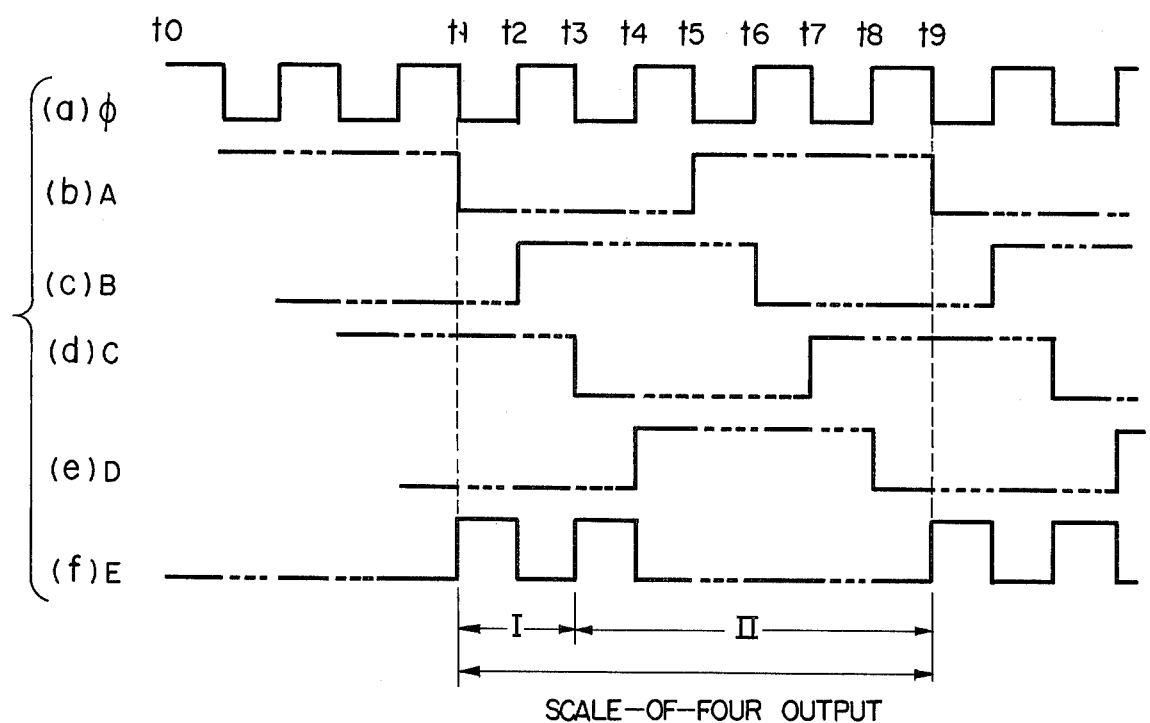
SCALE-OF-FOUR OUTPUT

SCALE-OF-FIVE OUTPUT

FREQUENCY DIVIDER WITH ONE-PHASE CLOCK PULSE GENERATING CIRCUIT

BACKGROUND OF THE INVENTION

This invention relates to an improved frequency divider for dividing the frequency of an output pulse from a crystal oscillating circuit by a counter formed of a plurality of complementary insulated gate field effect transistors (abbreviated as "IGFET's").

FIG. 1 illustrates a prior art frequency divider provided with a binary counter formed of complementary IGFET's. An output from a crystal oscillating circuit 1 is supplied to the junction of the gates of a P channel type IGFET 2 and an N channel type IGFET 3 jointly constituting a first inverter 4. The IGFET's 2, 3 are connected in series between two power supply terminals, namely between a $V_{DD}$ terminal and the ground to constitute a complementary IGFET type inverter. An output $\phi$ from the first inverter 4 is conducted from the output terminal of the first inverter 4, that is, the junction of the IGFET's 2, 3 to the input terminal of a second inverter 5, that is, the gate junction of IGFET's 6, 7 constituting the second inverter 5. An output from the second inverter 5 is sent forth from the junction of the IGFET's 6, 7 in the form $\bar{\phi}$ inverted from the output $\phi$ from the inverter 4. The output $\phi$ from the first inverter 4 is transferred to the gate of an N channel type IGFET 10 included in a first complementary unit circuit 9 of a binary counter 8 and also to the gate of a P channel type IGFET 12 included in a second complementary unit circuit 11. An output $\bar{\phi}$ from the second inverter 5 is delivered to the gate of a P channel type IGFET 13 included in the first complementary unit circuit 9 and also to the gate of an N channel type IGFET 14 included in the second complementary unit circuit 11. An output from the binary counter 8 is conducted to an output terminal 18 of said counter 8 through an inverter 17 formed of IGFET's 15, 16, and also fed back to the gate junction of IGFET's 19, 20 included in the first complementary unit circuit 9. An output from said first complementary unit circuit 9 is carried from the junction of the series connected IGFET's 19, 20 to the gate junction of IGFET's 21, 22 of the second complementary unit circuit 11.

With the prior art frequency divider of FIG. 1, an output $\phi$ from the first inverter 4 has a pulse wave form whose higher level represents $V_{DD}$ volts and whose lower level denotes a zero volt as shown in FIG. 2(a). Therefore, an output B from the second inverter 5 is a pulse $\bar{\phi}$ having an opposite polarity to the output $\phi$ from the first inverter 4 as shown in FIG. 2(b). Namely, said output $\bar{\phi}$ from the second inverter 5 is of the same polarity as an input to the first inverter 4, that is, an output A from the crystal oscillating circuit 1.

Now let it be assumed that an output from the inverter 17 has a logic level of "0" at time $t1$, as shown in FIG. 2(e). Then, an input having a logic level of "0" is supplied to the input terminal of the first complementary unit circuit 9, causing the IGFET 19 to be rendered conducting and the IGFET 20 to become inoperative. Since, at this time, the pulse $\bar{\phi}$ also has a logic level of "0", the IGFET 13 is rendered conducting, and an output C from the first complementary unit circuit 9 has a higher level of "1" as shown in FIG. 2(c). When the level of the pulse $\phi$ is changed to "0" at time $t2$, then an output B from the second inverter 5 has its logic level shifted to "1", causing the IGFET 13 to become inoperative. Since, however, the IGFET 10 also becomes inoperative at this time, the logic level of the output C from the first complementary unit circuit 9 does not indicate "0", but is kept at "1". The output C causes the IGFET 21 of the second complementary unit circuit 11 to be rendered inoperative and the IGFET 22 to become operative. The IGFET 14 is also rendered conducting upon receipt of the pulse $\bar{\phi}$ having a logic level of "1". Therefore, an output D from the second complementary unit circuit 11 has its logic level changed to "0", as shown in FIG. 2(d). At time $t3$, the $\phi$ signal has a logic level of "1", and the $\bar{\phi}$ signal has a logic level of "0". Consequently, an output C from the first complementary unit circuit 9 has its logic level shifted to "0", as shown in FIG. 2(c), while an output D from the second complementary unit circuit 11 has its logic level kept to "0". Therefore an output E from the frequency divider has its logic level kept at "1". At time $t4$, an output C from the first complementary unit circuit 9 has its logic level kept at "0". An output D from the secondary complementary unit circuit 11 has its logic level shifted to "1", and an output E from the frequency divider has its logic level shifted to "0". When the above-mentioned cycle of operation continues to time $t6$, then the frequency divider issues one output E for every two periods of a clock pulse $\phi$ represented by times $t2$ to $t6$. This means that the clock pulse $\phi$ or $\bar{\phi}$ has its frequency divided into halves.

FIG. 1 shows one stage of a binary counter constituted of a plurality of complementary unit circuits. Where this binary counter is used with an electronic timepiece or other electronic devices, a plurality of said counters are connected in series as shown in FIGS. 3 or 4.

In the case of FIG. 3, an output $\phi$ from the crystal oscillating circuit 1 is supplied to the $\phi$ input terminal of a first stage binary counter 23 and an output $\bar{\phi}$ from an inverter 24 is conducted to the $\bar{\phi}$ input terminal of said first stage binary counter 23. Outputs $Q_1$, $\bar{Q}_1$ from the binary counter 23 are supplied to the $\phi$, $\bar{\phi}$ input terminals of the succeeding binary counter 25 respectively. Similarly, outputs $Q_2$, $\bar{Q}_2$, $Q_3$, $\bar{Q}_3$ from the binary counters 25, 26 are delivered to the $\phi$, $\bar{\phi}$ input terminal of each of succeeding binary counters 26, 27. Since the prior art frequency divider of FIG. 3 comprises four binary counters 23, 25, 26, 27, an output clock pulse from the crystal oscillating circuit 1 has its original frequency divided to an extent of $1/2^4$, that is, into sixteenth parts at the output terminal of the last counter 27. The prior art frequency divider of FIG. 3 comprises an inverter 1a, crystal oscillating element 1b, resistor 1c, input capacitor 1d and output capacitor 1e connected between both ends of the resistor 1c and the ground.

With another prior art frequency divider of FIG. 4, an output clock pulse from the crystal oscillating circuit 1 is sent forth to the $\phi$ input terminal of the binary counter 23 through first and second inverters 28, 29. An output from the inverter 28 is conducted to the $\bar{\phi}$ input terminal of said binary counter 23. In other respects, the prior art frequency divider of FIG. 4 is arranged and operated in the same manner as that of FIG. 3. The inverters 28, 29 are used for the shaping of clock pulses.

Generally, with $f\phi$ taken to denote the frequency of an output clock pulse from a crystal oscillating circuit 1, $n$ to indicate a number of binary counters used, then an output from the last stage binary counter has a frequency $f0$ expressed as $f0 = f\phi/2^n$.

For example, where the frequency $f\phi$ of the crystal oscillating circuit 1 is 4.194304 MHz and binary counters are provided in a number of four stages, then an output from the last binary counter has a divided frequency $f0$ of 262.144 KHz.

The above-mentioned prior art frequency dividers have the drawbacks that since an output clock pulse from a crystal oscillating element 1b does not take a thoroughly rectangular waveform, it is necessary to provide waveform shapers such as inverters 28, 29 shown in FIG. 4, leading to considerable power consumption in said inverters 28, 29. For example, when the crystal oscillating element 1b has a frequency of 4.194304 MHz and a power source $V_{DD}$ has 3 volts, then the inverter 1a consumes power of 90 μw and the inverter 28 60 μw, thus appreciably increasing an amount of power consumed by the inverters 28, 29. An electronic timepiece, for example, is generally operated over a year by a single or two dry cells. From this point of view, the inverters are preferred to consume as little power as possible, and particularly, the inverters 28, 29 are demanded to consume no power.

With the 2-phase binary counter, a frequency divider gets unstable or erroneous in operation when phase difference exists between the signals $\phi$, $\phi$. Particularly, the higher the frequency of the crystal oscillating element 1b, the more deformed the waveform of an output from the inverter 1a. This event makes it necessary to provide a shaping inverter, and results in complicated circuit arrangement and large power consumption.

SUMMARY OF THE INVENTION

It is accordingly the object of this invention to provide a frequency divider consuming only a small amount of power, attaining stable operation and particularly adapted for division of the high frequency of a crystal oscillating circuit.

This invention has adopted a system by which an output clock pulse from a crystal oscillating circuit comprising a crystal oscillating element, inverter, resistor, input capacitor and output capacitor is supplied to a counter operative by a one-phase clock pulse. This system which enables the counter to be operated by a one-phase clock pulse eliminates the instability of a frequency divider resulting from phase difference between 2-phase clock pulses as observed in the prior art frequency divider, and prominently decreases power requirement due to the absence of an inverter for shaping oscillated clock pulses.

A counter used with a frequency divider embodying this invention is of special arrangement and can be operated zon an $n$-scale upon receipt of a one-phase clock pulse. This $n$-scale counter has the characteristics listed below:

(a) The counter comprises a plurality of cascade-connected complementary unit circuits each consisting of a series circuit of IGFET's connected between power supply terminals with IGFET's disposed on one side of an imaginary border line connecting the input and output terminals of said complementary unit curcuit chosen to have a different channel type from those provided on the other side of said border line.

(b) The first and last complementary unit circuits are asymmetric ones in which IGFET's are provided in different numbers on both sides of the above-mentioned border line connecting the input and output terminals of the respective complementary unit circuits.

(c) In an even number scale counter, the other complementary unit circuits of the counter than the first and last ones are symmetric ones in which IGFET's are provided in the same number on both sides of the aforesaid border line connecting the input and output terminals of the respective complementary unit circuits.

(d) In an odd number scale counter, there is at least one asymmetric complementary unit circuit in addition to the above-mentioned symmetric ones.

(e) A closed loop is provided in the counter, such that the one-phase clock pulse is supplied to the prescribed different IGFET's of all the complementary unit circuits of the counter and an output from the last complementary unit circuit of the counter is conducted to the prescribed different IGFET's of all the complementary unit circuits.

BRIEF DESCRIPTION OF THE DRAWING

FIGS. 9, 11, 13 and 15 are circuit diagrams of 3-, 4-, 5- and 6-scale counters respectively used with frequency dividers according to various embodiments of the invention; and FIGS. 10, 12, 14 and 16 show the waveforms of signals, for illustrating the operation of the counters of FIGS. 9, 11, 13 and 15.

DETAILED DESCRIPTION OF THE INVENTION

Figure 1:
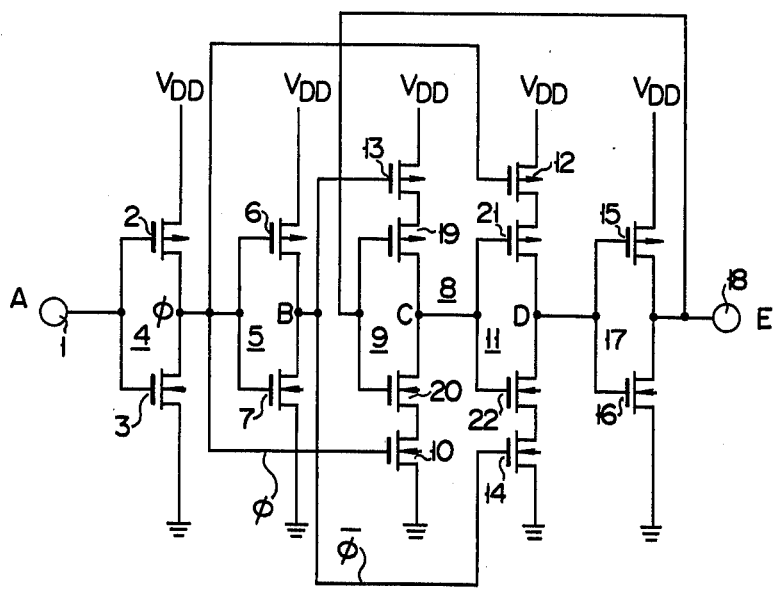
FIG. 1 is a circuit diagram of a prior art binary counter formed of complementary type IGFET's.
Figure 2:
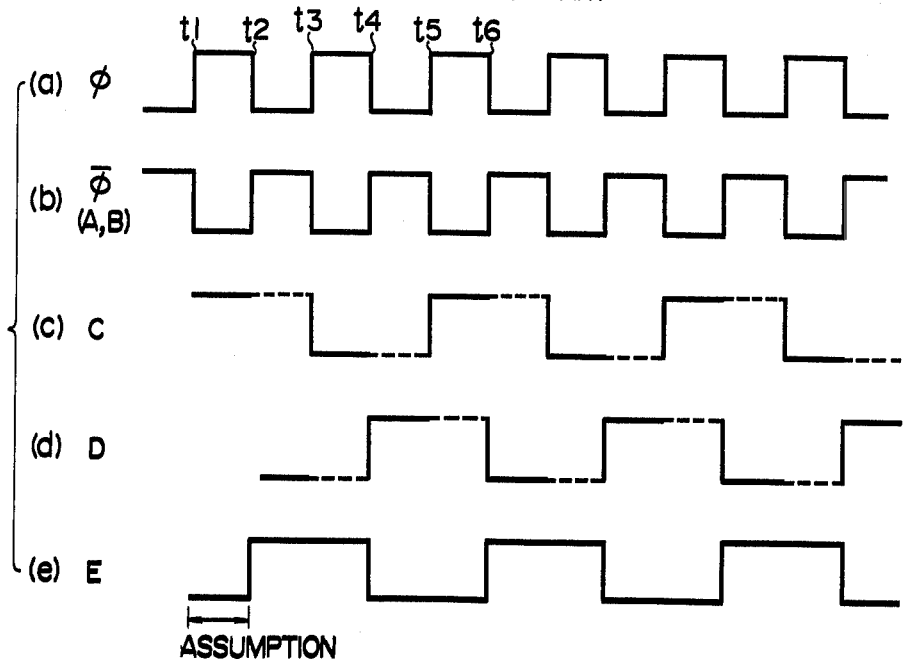
FIG. 2 shows the waveforms of signals for illustrating the operation of the binary counter of FIG. 1.
Figure 3:
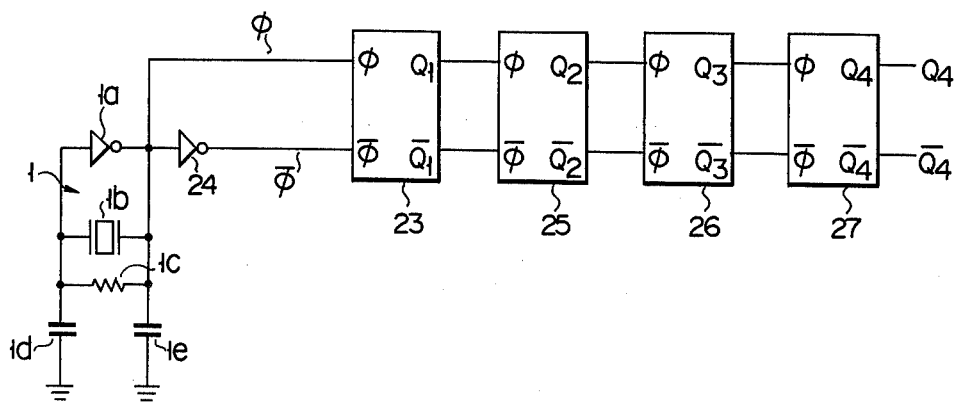
FIGS. 3 and 4 are block circuit diagrams of the prior art frequency divider formed of a plurality of binary counters shown in FIG. 1.
Figure 4:
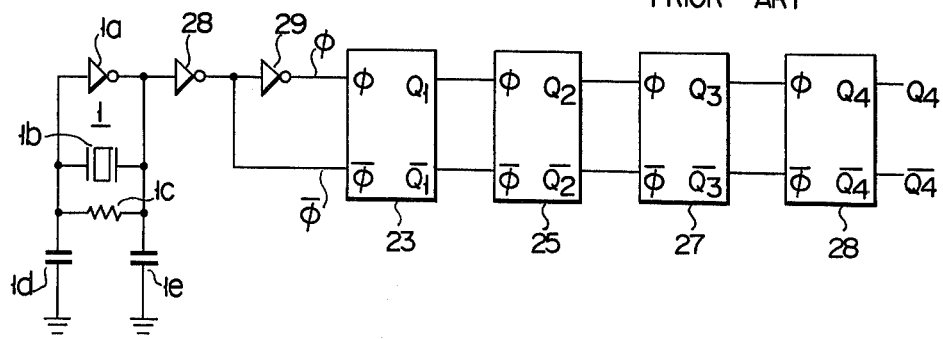
Figure 5:
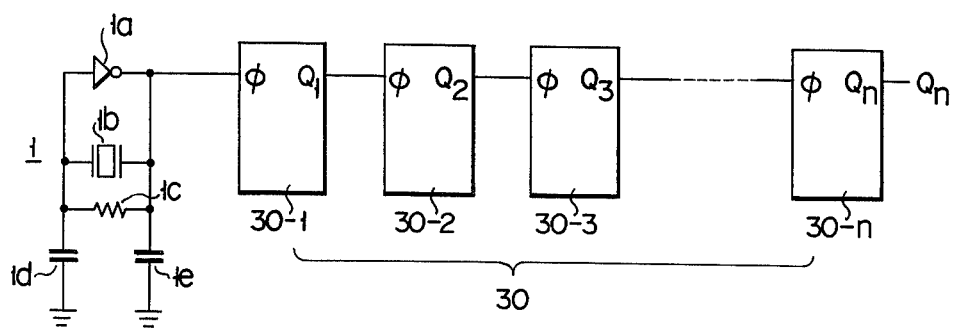
FIG. 5 is a block circuit diagram of a frequency divider according to an embodiment of the invention.

Throughout the following description, parts the same as those of FIG. 1 to 4 are denoted by the same numerals. Referring to FIG. 5, an output one-phase clock pulse $\phi$ from a crystal oscillating circuit used as a clock pulse oscillator is supplied to the $\phi$ input terminal of a first binary counter 30-1 of a frequency divider 30 from the output side of an inverter 1a. An output $Q_1$ from the first binary counter 30-1 is conducted to the $\phi$ input terminal of a second binary counter 30-2. Similarly, an output from the other binary counters 30-3 to 30-$n$-1 are delivered to the respective succeeding binary counters 30-4 to 30-$n$. According to the frequency divider of this invention shown in FIG. 5, an output from the crystal oscillating circuit 1 having a frequency of $f\phi$ is divided to an extent of $1/2^n$ by binary counters of an $n$ number and sent forth from the output terminal $Q_n$ of the last binary counter 30-$n$. Obviously, substitution of the binary counters 30-1 to 30-$n$ by, for example, a 3-scale type can provide a subject frequency divider all the same.

Figure 6:
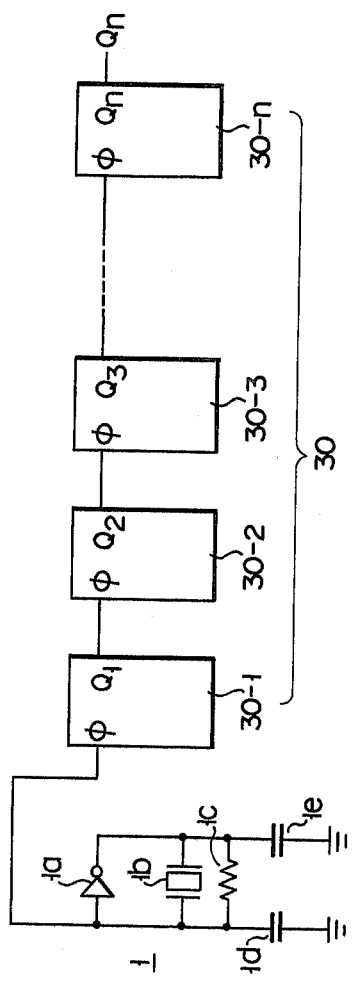
FIG. 6 is a block circuit diagram of a frequency divider modified from that of FIG. 5.

FIG. 6 is a modification of FIG. 5, in which an output from the crystal oscillating circuit 1 is carried from the input side of the inverter 1a to the $\phi$ input terminal of the first binary counter 30-1. FIG. 6 admits of the same frequency-dividing operation as in FIG. 5.

Figure 7:
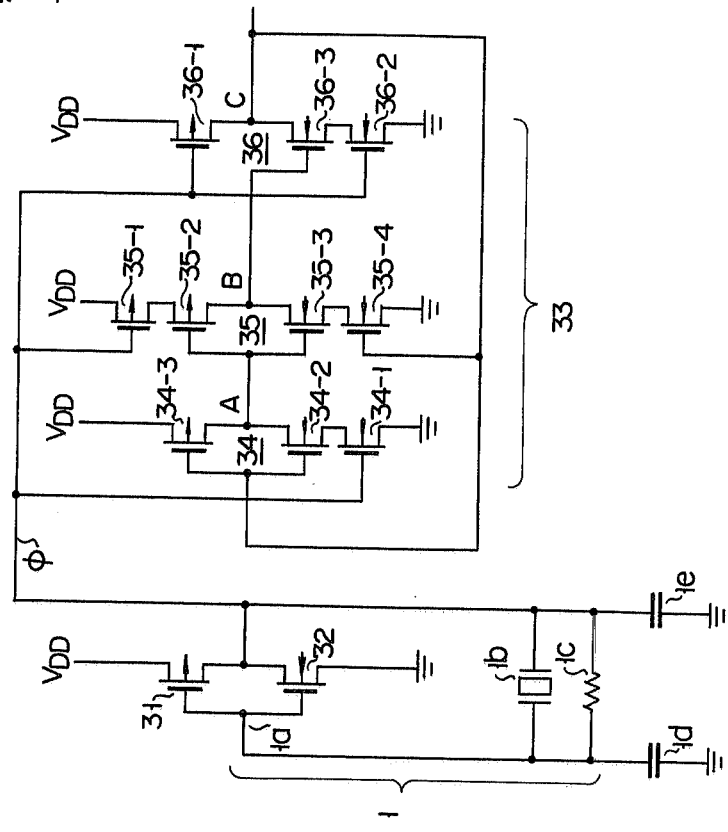
FIG. 7 is a circuit diagram of a frequency divider according to another embodiment of the invention, showing the concrete arrangement of a binary counter.

Referring to FIG. 7, the inverter 1a included in the crystal oscillating circuit 1 is formed of a P channel type IGFET 31 and N channel type IGFET 32 connected in series between the power supply terminal $V_{DD}$ and ground. The gates of the IGFET's 31, 32 are connected together to constitute the input terminal of the inverter 1a and also jointly connected to one terminal of a crystal oscillating element 1c. Junction of the IGFET's 31, 32 constitutes the output terminal of the inverter 1a, from which a clock pulse $\phi$ (FIG. 8(a)) is issued. This clock pulse $\phi$ is supplied to the gates of an N channel type IGFET 34-1, P channel type IGFET 35-1, P channel type IGFET 36-1 and N-channel type IGFET 36-2. A first complementary unit circuit 34 comprises N channel type IGFET's 34-1, 34-2 and P channel type IGFET 34-3 all connected in series between the power supply terminal $V_{DD}$ and ground. The input terminal of said first complementary unit circuit 34 which is constituted by the junction of the gates of the IGFET's 34-2, 34-3 is connected to the output terminal of a third complementary unit circuit 36.

The junction of the IGFET's 34-2, 34-3 constitutes the output terminal of the first complementary unit circuit 34. This output terminal is connected to the junction of the gates of IGFET's 35-2, 35-3 jointly constituting the input terminal of the succeeding complementary unit circuit 35. This complementary unit circuit 35 has an IGFET 35-4 having a gate connected to the output terminal of the third complementary unit circuit 36 and the IGFET 35-4 is connected between the IGFET 35-3 and the ground. One end of an IGFET 35-1 included in the second complementary unit circuit 35 is connected to the power supply terminal $V_{DD}$. The junction of the IGFET's 35-2, 35-3 constitutes the output terminal of the second complementary unit circuit 35. This output terminal is connected to the gate of the IGFET 36-3 of the third complementary unit circuit 36. The P channel type IGFET 36-1 and N channel type IGFET's 36-2, 36-3 of the third complementary unit circuit 36 are connected in series between the power supply terminal $V_{DD}$ and the ground.

Figure 8:
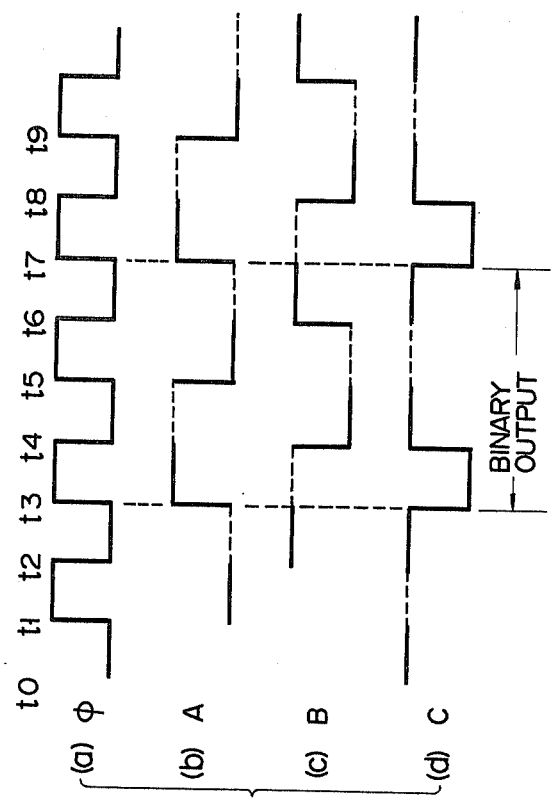
FIG. 8 shows the waveforms of signals for illustrating the operation of the frequency divider of FIG. 7.

There will now be described by reference to FIG. 8 the operation of the frequency divider of FIG. 7. Since the first, second and third complementary unit circuits 34, 35, 36 jointly constitute one stage binary counter, an output clock pulse $\phi$ from the inverter 1a has its frequency divided into halves at the output terminal of said counter.

At time $t0$, an output clock pulse $\phi$ (FIG. 8(a)) from the inverter 1a has a logic level of "0", causing the IGFET 36-1 to be rendered conducting and the output terminal of the circuit 36 to have a logic level of "1" (FIG. 8(d)). Since the output of "1" from the third complementary unit circuit 36 is fed back to the input terminal of the first complementary unit circuit 34, the IGFET 34-2 becomes operative and the IGFET 34-3 is rendered nonconducting. Since the output clock pulse $\phi$ from the inverter 1a has a logic level of "0" at time $t0$, the IGFET 34-1 becomes inoperative and the IGFET's 34-3, 34-2, 34-1 disposed between the power supply terminal $V_{DD}$ and the output terminal of the first complementary unit circuit 34 as well as between said output terminal and the ground are all rendered nonconducting. Consequently, the output terminal of the circuit 34 has an undeterminable logic level. Since an input to the second complementary unit circuit 35 has an unknown logic level, the output B of the second complementary unit circuit 35 also has an unidentifiable logic level.

When, at time $t1$, the output clock pulse $\phi$ from the inverter 1a has a logic level of "1", then the IGFET 34-1 is rendered conducting, causing the output A of the first complementary unit circuit 34 to have a logic level of "0" (FIG. 8(b)). As the result, the IGFET 35-3 of the complementary unit circuit 35 becomes inoperative and in consequence the IGFET 35-1 is also rendered nonconducting, thereby keeping the logic level of the output B of the second complementary unit circuit 35 unchanged.

When, at time $t2$, the output clock pulse $\phi$ from the inverter 1a has a logic level of "0", The IGFET 34-1 becomes inoperative and in consequence the IGFET 34-3 is rendered nonconducting. Therefore, the output A of the first complementary unit circuit 34 has its logic level kept at "0" (FIG. 8(b)). As the result, the IGFET 35-1 becomes operative with the IGFET 35-2 rendered conducting, causing the output B of the second complementary unit circuit 35 to have a logic level of "1" (FIG. 8(c)). With the third complementary unit circuit 36, the IGFET 36-3 becomes inoperative and the IGFET 36-1 is rendered opeative, causing the logic level of the output C of the third complementary unit circuit 36 to be kept at "1" (FIG. 8(d)).

When, at time $t3$, the output clock pulse $\phi$ from the inverter 1a has a logic level of "1", then the IGFET's 36-2, 36-3 of the third complementary unit circuit 36 are rendered operative, because the level of the output B of the second complementary unit circuit 35 is "1", causing the output C of the third complementary unit circuit 36 to have a logic level of "0" (FIG. 8(d)). Since the IGFET 34-3 becomes operative and the IGFET 34-2 is rendered nonconducting, the output A of the first complementary unit circuit 34 has a logic level of "1" (FIG. 8(b)). As the result, the IGFET's 35-2 and 35-4 of the second complementary unit circuit 35 become nonconducting, causing the logic level of the output B of the second complementary unit circuit 35 to be kept at "1" (FIG. 8(c)).

Thus at time $t4$, the output clock pulse $\phi$ from the inverter 1a has a logic level of "0". The outputs A, B, C of the first, second and third complementary unit circuits 34, 35, 36 have logic levels of "1", "0" and "1" respectively. At time $t5$, the output clock pulse $\phi$ has a logic level of "1" and the outputs A, B, C have logic levels of "0", "0" and "1". At time $t6$, the output clock pulse $\phi$ has a logic level of "0", and the outputs A, B, C have logic levels of "0", "1" and "1". At time $t7$, the output clock pulse $\phi$ has a logic level of "1" and the outputs A, B, C have logic levels of "1", "1" and "0". Thus, an output clock pulse whose frequency has been divided into halves is produced for every two periods of the clock pulse $\phi$ at the output terminal of the counter 33.

Figure 9:
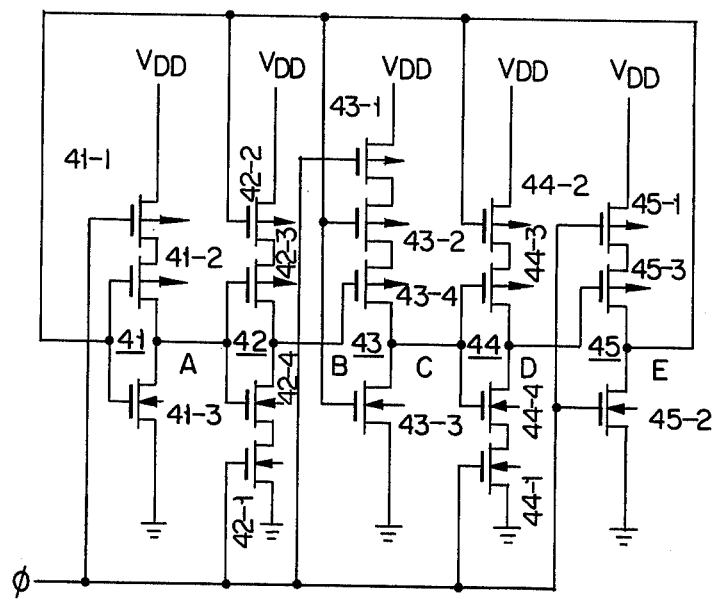

FIG. 9 shows a frequency divider using a 3-scale counter. An output clock pulse $\phi$ from the crystal oscillating circuit is supplied to the gates of IGFET's 41-1, 42-1, 43-1, 44-1, 45-1, 45-2 of the first to fifth complementary unit circuits 41 to 45. An output E from the last complementary unit circuit 45 is fed back to the input terminal of the first complementary unit circuit 41, namely to the gate junction of the IGFET's 41-2, 41-3 and also to the gates of the IGFET's 42-2, 43-2, 43-3, 44-2 of the complementary unit circuits 42 to 44. The first complementary unit circuit 41 comprises IGFET's 41-1, 41-2, 41-3 connected in series between the power supply terminal $V_{DD}$ and the ground. The second complementary unit circuit 42 comprises P channel type IGFET's 42-2, 42-3 and N channel type IGFET's 42-1, 42-4 connected in series between the power supply terminal $V_{DD}$ and the ground. The third complementary unit circuit 43 comprises P channel type IGFET's 43-1, 43-2, 43-4 and N channel type 43-3 connected in series between the power supply terminal $V_{DD}$ and the ground. With the fourth complementary unit circuit 44, P channel type IGFET 44-2 and N channel type IGFET 44-1 are disposed between the power supply terminal $V_{DD}$ and the ground in symmetric relationship with respect to an imaginary border line connecting the input and output terminals of said fourth complementary unit circuit 44. Similarly, P channel type IGFET 44-3 and N channel type IGFET 44-4 are provided between the power supply terminal $V_{DD}$ and the ground in symmetric relationship with respect to said border line. The fifth complementary unit circuit 45 comprises P channel type IGFET's 45-1, 45-3 and N channel type IGFET 45-2 connected in series between the power supply terminal $V_{DD}$ and the ground. An output from the first complementary unit circuit 41 is conducted from the junction of the IFGET's 41-2, 41-3 to the gate junction of the IGFET's 42-3, 42-4. An output from the second complementary unit circuit 42 is delivered from the junction of the IGFET's 42-3, 42-4 to the gate of the IGFET 43-4. An output from the third complementary unit circuit 43 is transmitted from the junction of the IGFET's 43-4, 43-3 to the gate junction of the IGFET's 44-3, 44-4. An output from the fourth complementary unit circuit 44 is sent forth from the junction of the IGFET's 44-3, 44-4 to the gate of the IGFET 45-3.

Figure 10:
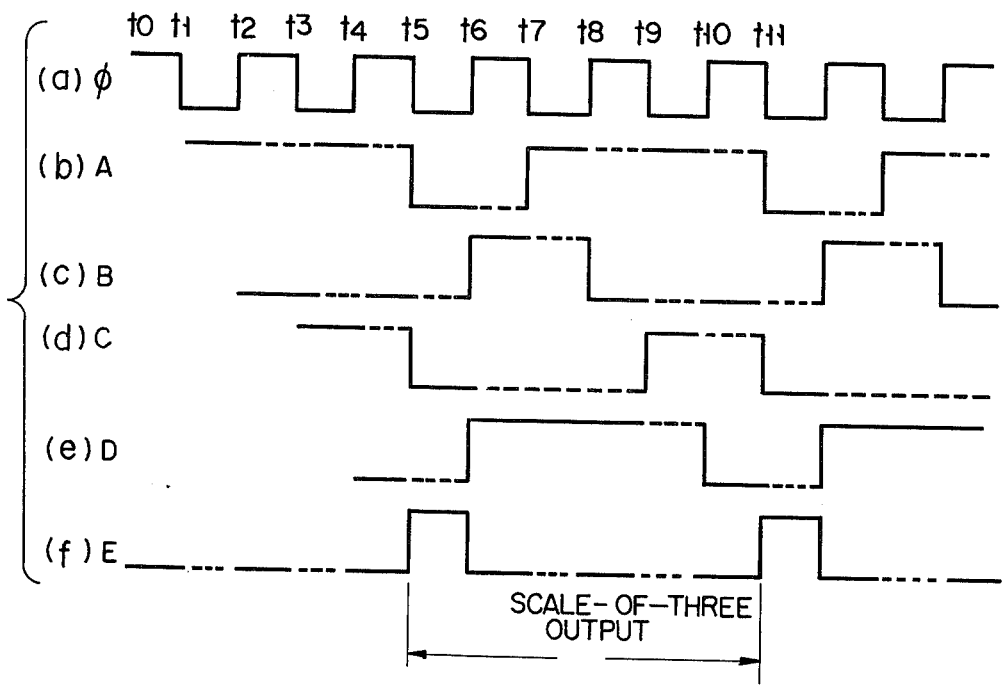

Since the counter of FIG. 9 is of the 3-scale type, the frequency of an input clock pulse $\phi$ is produced at the output terminal of said counter in the form divided into three equal parts. There will now be described by reference to FIG. 10 the operation of the counter of FIG. 9. When an input pulse $\phi$ has a logic level of "1" at time $t0$, the IGFET 45-2 becomes operative, causing an output E from the fifth complementary unit circuit 45 to have a logic level of "0" (FIG 10(f)). Since, under this condition, the IGFET's 41-1, 41-3, becomes inoperative, an output A from the first complementary unit circuit 41 has an undeterminable logic level and in consequence outputs B, C, D from the second, third and fourth complementary unit circuits 42 to 44 have unidentifiable logic levels.

When, at time $t1$, an input pulse $\phi$ has a logic level of "0", the IGFET's 41-1, 41-2 become conducting, causing an output A from the first complementary unit circuit 41 to have a logic level of "1" (FIG. 10(b)). Upon receipt of said output of "1", the IGFET 42-4 of the second complementary unit circuit 42 is rendered conducting, while the IGFET's 42-1, 42-3 become inoperative. Therefore, an output B from the second complementary unit circuit 42 has an unknown logic level, and outputs C, D from the third and fourth complementary unit circuits 43, 44, remain undefinable. An output E from the fifth complementary unit circuit 45 continues to have a logic level of "0".

When, at time $t2$, an input pulse $\phi$ has a logic level of "1", the output E from the fifth complementary unit circuit 45 has a logic level of "0", and an output A has its logic level kept at "1". Therefore, the IGFET's 42-1, 42-4 are rendered conducting, causing an output B from the second complementary unit circuit 42 to have a logic level of "0" (FIG. 10(c)). Since at this time, the IGFET's 43-1, 43-3 become inoperative, the logic level of an output C from the third circuit 43 is undeterminable, keeping the logic level of an output D from the fourth complementary unit circuit 44 undefinable.

When, at time $t3$, an input pulse $\phi$ has a logic level of "0", the IGFET 45-1 becomes operative, whereas the IGFET 45-2 is rendered nonconducting, causing the logic level of an output E from the fifth complementary unit circuit 45 to be kept at "0". As the result, the IGFET's 41-1, 41-2 become operative, causing an output A from the first complementary unit circuit 41 to have a logic level of "1". Thus, the IGFET's 42-1, 42-3 are rendered nonconducting, causing the logic level of an output B from the second complementary unit circuit 42 to be kept at "0". The IGFET's 43-1, 43-2, 43-4 are rendered conducting, and an output C from the third complementary unit circuit 43 has a logic level of "1". The IGFET's 44-1, 44-3 become inoperative and an output D from the fourth complementary unit 44 remains unknown.

When, at time $t4$, an input pulse $\phi$ has a logic level "1", the IGFET's 41-1, 43-1, 45-1 are rendered nonconducting, and the IGFET's 42-1, 44-1, 45-2 become operative, causing an output E from the fifth complementary unit circuit 45 to have a logic level of "0" (FIG. 10(f)). Upon receipt of said "0" output, the IGFET's 41-2, 42-2, 43-2, 44-2 become conducting, and the IGFET's 41-3, 43-3 are rendered inoperative. As the result, the logic level of an output A from the first logic circuit 41 is kept at "1" (FIG. 10(b)). The IGFET 42-4 becomes operative, causing an output from the second complementary unit circuit 42 to have a logic level of "0" (FIG. 10(c)). Upon receipt of the output B of "0", the IGFET 43-4 becomes operative, whereas the IGFET's 43-1, 43-3 remain nonconducting, causing the logic level of an output C from the third circuit 43 to be kept at "1" (FIG. 10(d). The IGFET 44-3 is rendered inoperative and the IGFETs 44-4, 44-1 become conducting, causing an output D from the fourth complementary logic circuit 44 to have a logic level of "0" (FIG. 10(e)).

At time $t5$, an input pulse $\phi$ has a logic level of "0", causing the IGFET 45-1 of the fifth complementary unit circuit 45 to become operative and the IGFET 45-2 of said circuit 45 to be rendered nonconducting. Since an output D from the fourth complementary unit circuit 44 has a logic level of "0", the IGFET 45-3 becomes conducting, causing an output E from the fifth complementary unit circuit 45 to have a logic level of "1" (FIG. 10(f)). The IGFET 41-3 of the first complementary unit circuit 41 is rendered conducting, causing an output A from said circuit 41 to have a logic level of "0". Upon receipt of said output A of "0", the IGFET 42-3 of the second complementary unit circuit 42 becomes operative, whereas the IGFET's 42-1, 42-2 are rendered nonconducting, causing the logic level of an output B from the second complementary unit circuit 42 to be kept at "0" (FIG. 10(c)). Since an output E from the fifth complementary unit circuit 45 has a logic level of "1", the IGFET 43-3 of the third complementary unit circuit 43 becomes operative, causing an output C from the third complementary unit circuit 43 to have a logic level of "0". The IGFET's 44-1, 44-2 of the fourth complementary unit circuit 44 are rendered nonconducting, causing an output D from said circuit 44 to have a logic level of "0", regardless of the type of logic level of an output C from the third complementary unit circuit 43.

At time t6, an input pulse φ has a logic level of "1", causing the IGFET 45-2 of the fifth circuit 45 to become operative and an output E from said circuit 45 to have a logic level of "0" (FIG. 10(f)). During an interval between t4 and t7, the logic level of an output D from the fourth complementary unit circuit 44 is kept at "1", causing an output E from the fifth complementary unit circuit 45 to have a logic level of "0". Later, the logic level of the outputs A to E from the first to the fifth complementary unit circuits 41 to 45 varies as the logic level of an input clock pulse φ is changed from "1" to "0" or vice versa. At time t10, an output D from the fourth complementary unit circuit 44 has a logic level of "0". Since, however, an input pulse φ has a logic level of "1", the IGFET 45-1 becomes inoperative, causing the logic level of an output E from the fifth complementary unit circuit 45 to be kept at "0".

At time t11, an input pulse φ has a logic level of "0" and an output D from the fourth complementary unit circuit 44 also has a logic level of "0", causing the logic level of an output E from the fifth complementary unit circuit 45 to be shifted to "1".

As described above, a single period output E is sent forth from the fifth complementary unit circuit 45 for every three periods of an input pulse φ extending from t5 to t11, that is, said input pulse φ has its original frequency divided into three equal parts as shown in FIG. 10(f).

FIG. 11 shows a ¼ frequency division device using a 4-scale counter. The frequency divider of FIG. 11 has substantially the same circuit arrangement as that of FIG. 9, excepting that the third complementary unit circuit 43 is replaced by a symmetric complementary unit circuit 46. This symmetric complementary unit circuit 46 comprises two P channel type IGFET's 46-1, 46-2 and two N channel type IGFET's 46-3, 46-4 provided between the power supply terminal $V_{DD}$ and the ground in symmetric relationship with respect to an imaginary border line connecting the input and output terminals of said circuit 46, as in the case of the other complementary unit circuits 42, 44. The gate of the IGFET 46-1 is supplied with an input pulse φ. The gates of the IGFET's 46-2, 46-3 are jointly connected to the output terminal of the second complementary unit circuit 42 to receive an output B from said circuit 42. The gate of the IGFET 46-4 is supplied with an output E from the fifth complementary unit circuit 45.

There will now be described by reference to FIG. 12 ¼ frequency division carried out by the 4-scale counter of FIG. 11. During a transitory interval between t0 and t1, outputs A to E from the complementary unit circuits 41, 42, 46, 44, 45 respectively have undeterminable logic levels as illustrated in FIG. 12. Now let it be assumed that at time t1 at which the 4-scale counter commences normal operation, an input pulse φ has its logic level changed from "1" to "0". Then the logic level of the IGFET 45-1 of the fifth complementary circuit 45 becomes operative and the IGFET 45-2 thereof is rendered nonconducting. Since, at this time, an output D from the fourth complementary unit circuit 44 has a logic level of "0" (FIG. 12(e)), causing the IGFET 45-3 of the fifth complementary unit 45 to be rendered conducting and in consequence the logic level of an output E from said fifth complementary unit circuit 45 to be changed from "0" to "1" as shown in FIG. 12(f). As the result, the IGFET 41-2 of the first complementary unit circuit 41 becomes inoperative and the IGFET 41-3 thereof is rendered conducting, causing an output A from the first complementary unit circuit 41 to have a logic level of "0" (FIG. 12(b)). At this time, the IGFET 42-1, 42-2 of the second complementary unit circuit 42 become nonconducting, causing the logic level of an output B from said circuit 42 to be kept at "0". As the result, the IGFET's 46-1, 46-2 are rendered conducting, causing an output C from the complementary unit circuit 46 to have a logic level of "1" (FIG. 12(d)). Since the IGFET's 44-1, 44-2 of the fourth complementary unit circuit 44 are rendered nonconducting, an output D from said circuit 44 has its logic level kept at "0".

When, at time t2, an input pulse φ has a logic level of "1", the IGFET 45-1 of the fifth complementary unit circuit 45 becomes inoperative and the IGFET 45-2 is rendered conducting, causing an output E from said circuit 45 to have a logic level of "0". As the result, the IGFET 42-2 of the second complementary unit circuit 42 becomes conducting. Since, at this time, an output A from the first complementary unit circuit 41 has a logic level of "0" (FIG. 12(b)) and the IGFET 42-3 of the second complementary unit circuit 42 is already rendered conducting, an output B from said circuit 42 has a logic level of "1" (FIG. 12(c)). The logic level of an output C from the complementary unit circuit 46 is kept at "1", and the logic level of an output D from the fourth complementary unit circuit 44 is kept at "0".

When at time t3, an input pulse φ again has a logic level of "0" the IGFET 45-1 of the fifth complementary unit circuit 45 becomes conducting and the IGFET 45-2 thereof is rendered nonconducting. Since the IGFET 45-3 of the fifth complementary unit circuit 45 is rendered operative, an output E from said circuit 45 has a logic level of "1" (FIG. 12(f)).

When, at time t4, an input pulse has a logic level of "1", the IGFET 45-2 of the fifth complementary unit circuit 45 is rendered conducting, causing an output E from said circuit 45 to have a logic level of "0".

Later during an interval between t4 and t8, an output D from the fourth complementary unit circuit 44 has its logic level kept at "1" (FIG. 12(e)). As the result, the IGFET 45-3 of the fifth complementary unit circuit 45 is kept nonconducting, causing the logic level of an output E from said circuit 45 to be kept at "0" (FIG. 12(f)).

At time t8, an output D from the fourth complementary unit circuit 44 has a logic level of "0". At this time, however, an input pulse φ has a logic level of "1" and the IGFET 45-2 of the fifth complementary unit circuit 45 becomes operative, causing the logic level of an output E from the fifth complementary unit circuit 45 to be kept at "0".

At time t9, an input pulse φ has a logic level of "0", causing the IGFET 45-1 of the fifth complementary unit circuit 45 to be rendered conducting an the IGFET 45-2 thereof to become inoperative. Since an output D from the fourth complementary unit circuit 44 has a logic level of "0", and the IGFET 45-3 becomes operative, causing an output E from the fifth complementary unit circuit 45 to have a logic level of "1" (FIG. 12(f)).

The 4-scale counter of FIG. 11 produces an output E of one period for every four periods of an input pulse φ lying between t1 and t9. Part I of the period of said output E corresponds to one period of an input pulse φ defined between t1 and t3 and part II of the period of said output E corresponds to three periods of the input pulse φ extending from t3 to t9. The 4-scale counter of FIG. 11 repeatedly produces an output E in a waveform formed by a combination of a waveform corresponding to said partial period I and a waveform corresponding to said partial period II. With said combination of two waveforms taken to represent one period of said output E, the counter of FIG. 11 acts as ¼ frequency division device. A look at FIG. 12 shows that the frequency of an input pulse $\phi$ is divided into four equal parts.

Figure 13:
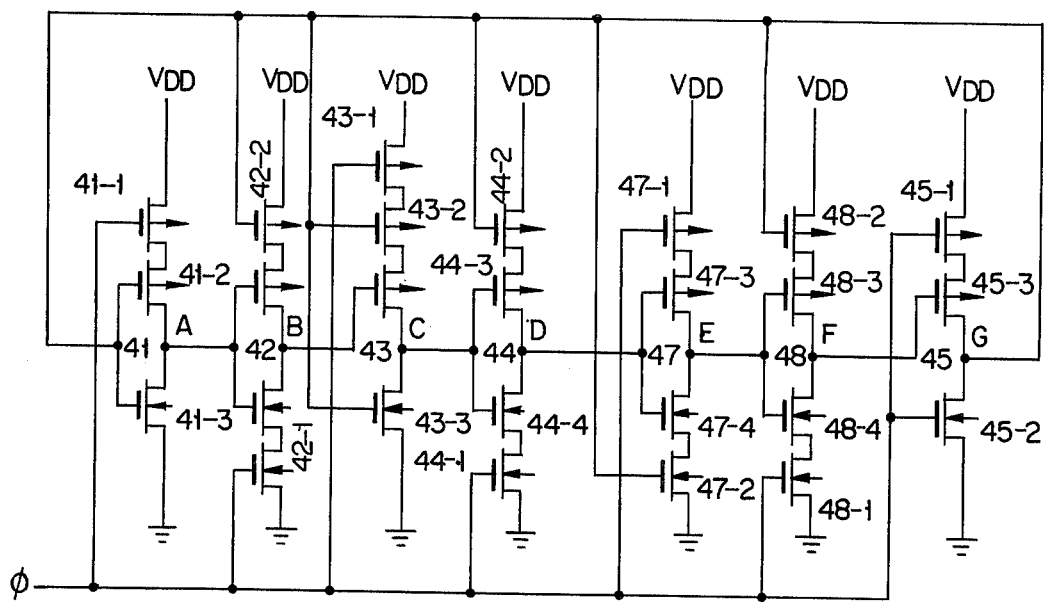

FIG. 13 shows a 1/5 frequency division device using a 5-scale counter. The 5-scale counter of FIG. 13 additionally comprises complementary unit circuits 47, 48 connected in cascade between the fourth complementary unit circuit 44 and final fifth complementary unit circuit 45 of the 3-scale counter of FIG. 9. These additional complementary unit circuits 47, 48 each comprise two P channel type IGFET's and two N channel type IGFET's arranged in symmetric relationship with respect to an imaginary border line connecting the input and output terminals of the respective circuits, as in the case of the second and fourth complementary unit circuits 42, 44 of the 3-scale counter of FIG. 9. The 5-scale counter of FIG. 13 repeatedly generates an output G of one period for every five periods of an input clock pulse $\phi$ lying between $t1$ and $t11$ shown in FIG. 14(a). One period of said output G consists of a combination of the part I corresponding to one period of an input clock pulse $\phi$ lying between $t1$ and $t3$ and the part II corresponding to four periods of the input clock pulse $\phi$ defined between $t4$ to $t11$. With the 5-scale counter of FIG. 13, an input clock pulse $\phi$ is supplied to the gates of IGFET's 41-1, 42-1, 43-1, 44-1, 45-1, 47-1, 48-1 of the complementary unit circuits 41, 42, 43, 44, 45, 47, 48. An output G from the final complementary unit circuit 46 is fed back to the gates of the IGFET's 41-2, 41-3, 42-2, 43-2, 43-3, 44-2, 47-2, 48-2 of the complementary unit circuits 41, 42, 43, 44, 47, 48. The gates of the IGFET's 41-2, 41-3 are jointly connected and the gates of the IGFET's 43-2, 43-3 are also jointly connected.

Figure 14:
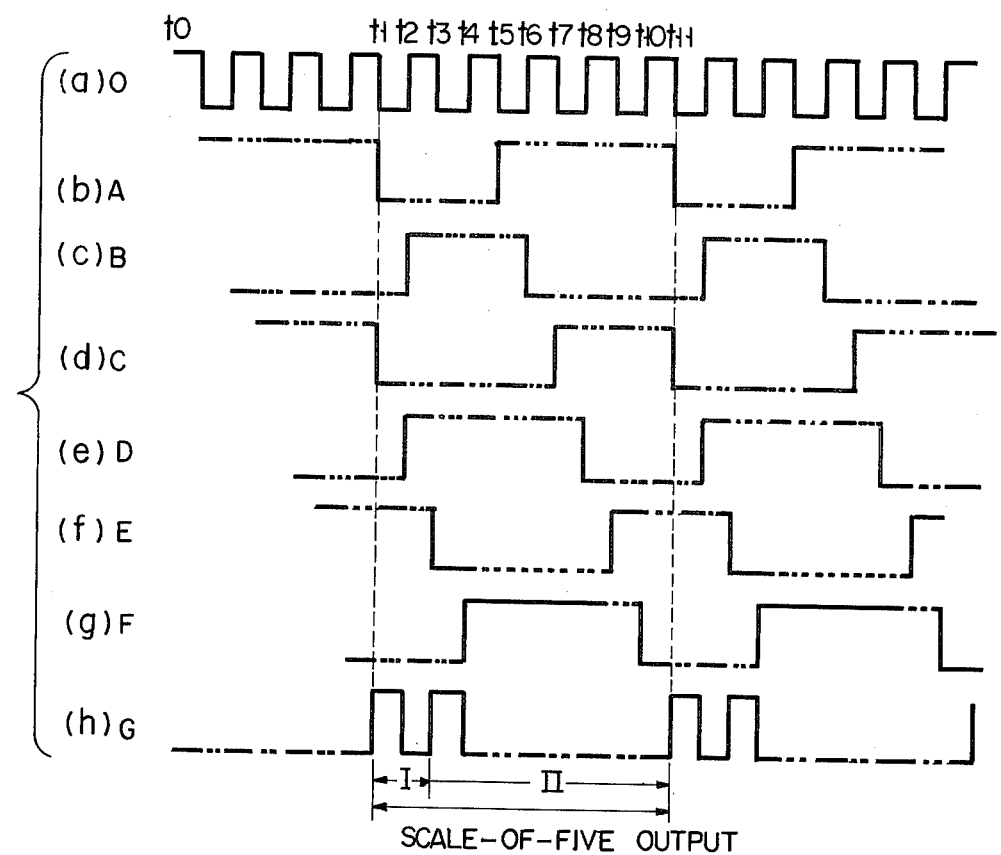

There will now be described by reference to FIG. 14 frequency division carried out by the 5-scale counter of FIG. 13. During a transitory interval between $t0$ and $t1$, outputs A to G each have an unidentifiable logic level as shown in FIG. 14. When, at time $t1$, an input clock pulse $\phi$ has a logic level of "0", then the IGFET 45-1 becomes operative, an output F from the additional complementary unit circuit 48 has a logic level of "0" (FIG. 14(g)), and the IGFET 45-3 is rendered conducting, causing an output G from the last complementary unit circuit 45 to have a logic level of "1" (FIG. 14 (h)). Upon receipt of the output G of "1" level, the IGFET 41-3 is rendered conducting, causing an output A from the first complementary unit circuit 41 to have a logic level of "0" (FIG. 14(b)). The IGFET's 42-1, 42-2 of the second complementary unit circuit 42 are rendered nonconducting regardless of the type of logic level of the output A, causing the logic level of an output B from the second complementary unit circuit 42 to be kept at "0" ( FIG. 14 (c)). Since an output G from the last complementary unit 45 has a logic level of "1", the IGFET 43-3 of the third complementary unit circuit 43 becomes conducting, causing an output C from said circuit 43 to have a logic level of "0" (FIG. 14(d)). Upon receipt of this output C of "0" level, the IGFET 44-3 of the complementary unit circuit 44 is rendered conducting, whereas the IGFET 44-2 is rendered nonconducting by an output G of "1" level, causing the logic level of an output D from the complementary unit circuit 44 to be kept at "0" (FIG. 14(e)). Upon receipt of the output D of "0" level, the IGFET 47-3 of the additional complementary unit circuit 47 becomes conducting, and the IGFET 47-1 is also rendered operative by an input clock pulse $\phi$, causing the logic level of an output E from said circuit 47 to be kept at "1" (FIG. 14(f)). Upon receipt of the output E of "1" logic level, the IGFET 48-3 becomes inoerative, and the IGFET 48-1 is also rendered nonconducting by an input clock pulse $\phi$ of "0" logic level, causing the logic level of an output F from said additional complementary unit circuit 48 to be kept "0" (FIG. 14(g)).

An output G from the last complementary unit 45 has a logic level of "0" at time $t2$, "1" at time $t3$ and again "0" at time $t4$ as shown in FIG. 14(h). During an interval from $t4$ to $t10$ in which an output F from the complementary unit circuit 48 has a logic level of "1" (FIG. 14(g)), the IGFET 45-3 is kept inoperative, causing the logic level of the output G to be kept at "0". At time $t10$, the output F has a logic level of "0" and the IGFET 45-3 becomes operative. At this time, an input clock pulse $\phi$ has a logic level of "1" and the IGFET 45-1 of the last complementary unit circuit 45 is rendered nonconducting, causing the logic level of an output G from said circuit 45 to be kept at "0". When, at time $t11$, an input clock pulse $\phi$ has a logic level of "0". The IGFET 45-1 is rendered operative and the logic level of an output G from the last complementary prior circuit 45 is changed to "1" (FIG. 14(h)). The 5-scale counter of FIG. 13 produces an output G of one period for every five periods of an input clock pulse $\phi$. The part I of the period of said output G corresponds to one period of the input clock pulse $\phi$ lying between $t1$ and $t3$, and the part II of said period corresponds to four periods of the input clock pulse $\phi$ defined between $t4$ and $t11$, showing that the frequency of an input clock pulse $\phi$ is divided into five equal parts.

Figure 15:
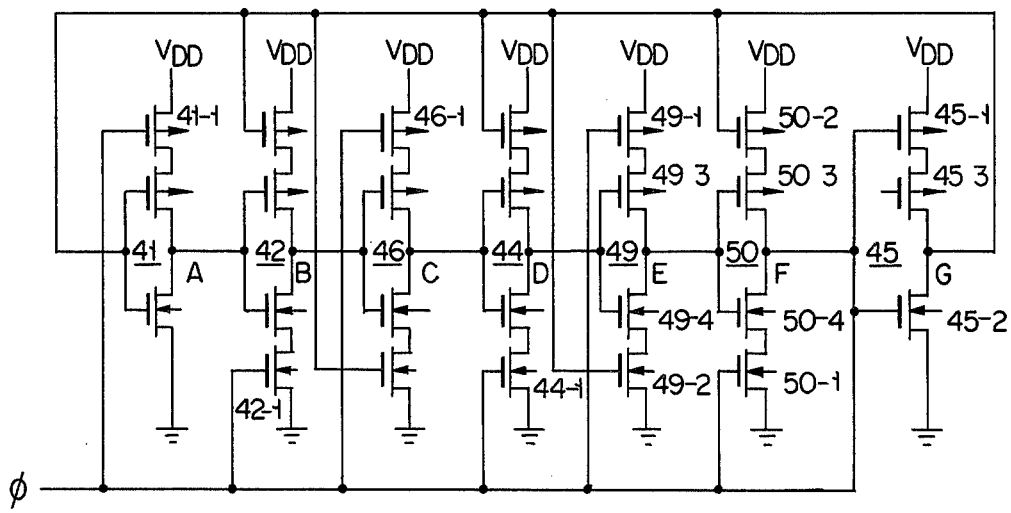

FIG. 15 shows a frequency divider for dividing the frequency of an input clock pulse $\phi$ to an extent of 1/6 by a 6-scale counter. This 6-scale counter of FIG. 15 comprises additional complementary unit circuits 49, 50 connected in cascade between the complementary unit circuits 44, 45.

These additional complementary unit circuits 49, 50 each comprises two P channel type IGFET's and two N channel type IGFET's arranged in symmetrical relationship with respect to an imaginary border line connecting the input and output terminals of the respective circuits, as in the case of the other complementary unit circuits 42, 46, 44. An input clock pulse $\phi$ is supplied to the gates of the IGFET's 49-1, 50-1 of said additional complementary unit circuits respectively, and an output G from the last complementary unit circuit 45 is fed back to the IGFET's 49-2, 50-2. The gate junction of the IGFET's 49-3, 49-4 constituting the input terminal of the additional complementary unit circuit 49 is connected to the output terminal of the complementary unit circuit 44. The junction of said IGFET's 49-3, 49-4 constituting the output terminal of said additional complementary unit circuit 49 is connected to the input terminal of another additional complementary unit circuit 50 which is constituted by the gate junction of the IGFET's 50-3, 50-4, the junction of said IGFET's 50-3, 50-4 constituting the output terminal of said another additional complementary unit circuit 50 is connected to the gate of the IGFET 45-3 of the last complementary unit circuit. In other respects, the 6-scale counter of FIG. 15 has the similar circuit arrangement as the 4-scale counter of FIG. 11.

Figure 16:
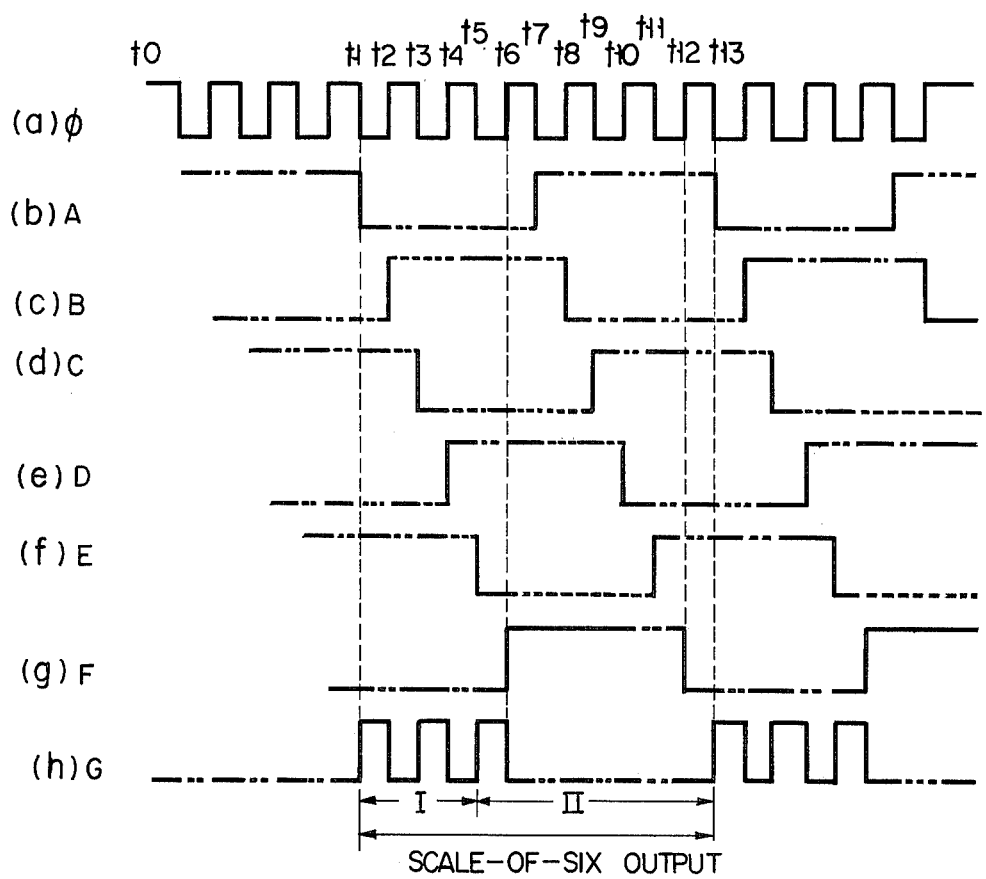

There will now be described by reference to FIG. 16, 1/6 frequency division carried out by the 6-scale counter of FIG. 15. During a transitory interval between $t0$ and $t1$ outputs A to G each have an undeterminable logic level as shown in FIG. 16. Now let it be assumed that at time $t1$ when the 6-scale counter commences normal operation, an input clock pulse $\phi$ has a logic level of "1". Since, at this time, the logic level of an output D from the complementary unit circuit 44 is kept at "0" (FIG. 16(e)), the IGFET 49-3 of the additional complementary unit circuit 49 becomes conducting. Since the input pulse $\phi$ has a logic level of "0", the IGFET 49-1 is rendered conducting, causing the logic level of an output E from said circuit 49 to be kept at "1". Upon receipt of this output E of "1" logic level, the IGFET 50-4 of another additional complementary unit 50 is rendered operative. However, the IGFET's 50-1, 50-2 of said circuit 50 are rendered nonconducting by the input pulse of "0" logic level and the output G respectively, causing the logic level of an ouput F from said circuit 50 to be kept at "0".

This output F has its logic level kept at "0" until time $t6$ as shown in FIG. 16(g), keeping the IGFET 45-3 of the last complementary unit circuit 45 conducting. Accordingly, the logic level of an output G from said circuit 45 varies, as shown in FIG. 16(h), according to the logic level of an input clock pulse $\phi$ with the same period of time during an interval between $t1$ and $t6$. At time t6, an output F from the additional complementary unit circuit 50 has a logic level of "1", which is sustained until $t12$. During this interval, therefore, the logic level of an output G from the last complementary unit circuit 45 is kept at "0", regardless of the logic level of the input clock pulse $\phi$. At time $t12$, an output F from the additional complementary unit circuit 50 has a logic level of "0", causing the IGFET 45-3 of the last complementary unit circuit 45 to become operative. At this time, however, an input clock pulse $\phi$ has a logic level of "1" and the IGFET 45-2 is rendered conducting, causing the logic level of the output G from the last complementary unit 45 to be kept at "0". At time $t13$, an input clock pulse $\phi$ has a logic level of "0" and the IGFET 45-1 becomes operative, causing the logic level of an output G to be changed to "1". Later, the cycle of the above-mentioned operation is repeated, causing an output G of one period to be produced for every six periods of an input clock pulse $\phi$, showing that the frequency of said input clock pulse $\phi$ is divided to an extent of 1/6.

FIGS. 7 to 16 show frequency dividers using one unit of 2-scale, 3-scale, 4-scale, 5-scale and 6-scale counters respectively. However, application of an $n$ number these counters provides frequency dividers capable of effecting frequency division to an extent of $1/2^n$ to $1/6^n$.

A counter of 7 to $n$ scale can be provided by much the same circuit arrangement as in the preceding embodiments. With the embodiments of FIGS. 7, 9, 11, 13 and 15, an input clock pulse $\phi$ and an output from the last complementary unit circuit 45 can be interchangeable supplied with the same effect as described above to two series-connected IGFET's disposed on either side of an imaginary border line connecting the input and output terminals of the respective complementary unit circuits. With the embodiment of FIG. 7, for example, it is possible to supply an output C from the last complementary unit circuit 36 to the IGFET 34-1 of the first complementary unit circuit 34 and supply an input clock pulse $\phi$ to the IGFET 34-2 of said circuit 34.

What we claim is:

1. A frequency divider comprising a one-phase clock pulse generating circuit and at least one counter for counting output clock pulses of the one-phase clock pulse generating circuit, wherein said counter comprises a plurality of cascade connected complementary unit circuits, each formed of at least three IGFETs connected in series across power supply terminals and supplied with said output clock pulses, said complementary unit circuits including a first stage complementary unit circuit having an inverter consisting of a first IGFET of one conductivity type and a second IGFET of the opposite conductivity type and a third IGFET connected between one of said power supply terminals and one of said first and second IGFETs and having a gate to receive said output pulses, and a last stage complementary unit circuit having fourth and fifth IGFETs having gates connected to the output of the one-phase clock pulse generating circuit and a sixth IGFET connected between the fourth and fifth IGFETs, said sixth IGFET having a gate connected to an output of a preceding complementary unit circuit, and the output of the last stage complementary unit circuit being supplied to an input of the inverter of the first stage complementary unit circuit and to at least one IGFET of each complementary unit circuit other than said first and last stage complementary unit circuits.

2. The frequency divider according to claim 1 wherein the counter is of an even number-scale type in which the complementary unit circuits other than the first and last complementary unit circuits comprise two P channel type IGFETs and two N channel type IGFETs arranged in symmetric relationship with respect to a border line dividing the IGFETs connected between the input and output terminals of the respective complementary unit circuits and one power supply terminal and the IGFETs connected between said input and output terminals of the respective complementary unit circuits and the other power supply terminal.

3. The frequency divider according to claim 2, wherein the counter is of a 2-scale type comprising a single complementary unit circuit, other than the first and last complementary units, in which IGFETs of different channel types are arranged in symmetric relationship with respect to said border line.

4. The frequency divider according to claim 2, wherein the counter is of a 4-scale type comprising first, second and third complementary unit circuits, in each of which IGFET's of different channel types are arranged in symmetric relationship with respect to said border line.

5. The frequency divider according to claim 2, wherein the counter is of a 6-scale type comprising first, second, third, fourth and fifth complementary unit circuits, in each of which IGFET's of different channel types are arranged in symmetric relationship with respect to said border line.

6. The frequency divider according to claim 1, wherein the counter is of an odd number-scale type in which complementary unit circuits (except for at least one) other than the first and last complementary unit circuits comprise two P channel type IGFET's and two N channel type IGFET's arranged in symmetric relationship with respect to said border line connecting the input and output terminals of the respective complementary unit circuits, and said at least one complementary unit circuit is of an asymmetric type which comprises IGFET's provided in different numbers on both sides of said border line.

7. The frequency divider according to claim 6, wherein the counter is of a 3-scale type which is formed of first and second complementary unit circuits, in each of which IGFET's of different channel types are arranged the symmetric relationship with respect to said border line, and one asymmetric complementary unit circuit which comprises IGFET's of different channel types provided in different numbers on both sides of said border line.

8. The frequency divider according to claim 6, wherein the counter is of a 5-scale type which is formed of first, second, third and fourth complementary unit circuits, in each of which IGFET's of different channel types are arranged in symmetric relationship with respect to said border line, and an asymmetric complementary unit circuit which comprises IGFET's of different channel types provided in different numbers on both sides of said border line.

* * * * *